United States Patent
Smith

(10) Patent No.: US 8,488,656 B2
(45) Date of Patent: Jul. 16, 2013

(54) OVERSAMPLED SYNTHESIZER SYSTEMS AND METHODS

(75) Inventor: Ronald P. Smith, Redondo Beach, CA (US)

(73) Assignee: Northrop Grumman Systems Corporation, Falls Church, VA (US)

( * ) Notice: Subject to any disclaimer, the term of this patent is extended or adjusted under 35 U.S.C. 154(b) by 337 days.

(21) Appl. No.: 12/881,722

(22) Filed: Sep. 14, 2010

(65) Prior Publication Data

US 2012/0063554 A1 Mar. 15, 2012

(51) Int. Cl.
*H04B 3/23* (2006.01)

(52) U.S. Cl.
USPC .......................................... 375/219; 375/220

(58) Field of Classification Search
USPC .......................................................... 375/219
See application file for complete search history.

(56) References Cited

U.S. PATENT DOCUMENTS

| | | | | |
|---|---|---|---|---|
| 5,848,097 | A * | 12/1998 | Carney et al. ................. | 375/219 |
| 7,095,781 | B1 * | 8/2006 | Hsu et al. ....................... | 375/224 |
| 7,145,972 | B2 * | 12/2006 | Kumar et al. ................. | 375/349 |
| 7,290,021 | B2 * | 10/2007 | Gray ............................. | 708/300 |
| 7,372,907 | B2 * | 5/2008 | Munoz et al. ................. | 375/260 |
| 7,620,673 | B2 * | 11/2009 | Noga ............................. | 708/300 |
| 8,045,654 | B1 * | 10/2011 | Anderson ..................... | 375/342 |
| 8,045,945 | B2 * | 10/2011 | Kawauchi et al. ............. | 455/296 |
| 8,077,760 | B2 * | 12/2011 | Chen ............................. | 375/211 |
| 8,223,859 | B2 * | 7/2012 | Heidari et al. ................. | 375/260 |
| 2001/0046225 | A1 * | 11/2001 | Schwaller et al. ............ | 370/343 |
| 2003/0033611 | A1 * | 2/2003 | Shapiro et al. ................ | 725/136 |
| 2003/0223503 | A1 * | 12/2003 | Song ............................. | 375/260 |
| 2005/0238116 | A1 * | 10/2005 | Monta ........................... | 375/298 |
| 2006/0212773 | A1 * | 9/2006 | Aytur et al. ................... | 714/755 |
| 2007/0067376 | A1 * | 3/2007 | Noga ............................. | 708/300 |
| 2007/0263738 | A1 * | 11/2007 | Jitsukawa et al. ............. | 375/260 |
| 2009/0147874 | A1 * | 6/2009 | Huh .............................. | 375/260 |
| 2009/0296861 | A1 * | 12/2009 | Sampath ....................... | 375/340 |
| 2010/0074349 | A1 * | 3/2010 | Hyllander et al. ............. | 375/260 |

OTHER PUBLICATIONS

Rao, et al.: "*FPGA Polyphase Filter Bank Study & Implementation*"; Image Communications/Reconfigurable Computing Lab. Electrical Engineering Dept. UCLA.

Vaidyanathan: "*Multirate Digital Filters, Filter Banks, Polyphase Networks, and Applications: A Tutorial*"; Proceedings of the IEEE, vol. 78, No. 1, Jan. 1990; p. 56-93.

* cited by examiner

*Primary Examiner* — Sam K Ahn
*Assistant Examiner* — Santiago Garcia
(74) *Attorney, Agent, or Firm* — Tarolli, Sundheim, Covell & Tummino LLP

(57) ABSTRACT

Systems and methods for combining digital input signals in an oversampled synthesizer system are provided. An inverse Fourier transform component is configured to receive a plurality of digital input signals, having a first sampled rate, and produce a corresponding representation of a wideband signal as a plurality of parallel outputs. A plurality of digital filters are each configured to apply a transfer function to an associated one of the parallel outputs to produce a filtered output. A number of filters in the plurality of digital filters is less than a number of parallel outputs of the inverse Fourier transform component, such that at least one of the parallel outputs is not provided to any filter of the plurality of digital filters. An interpolation component combines the plurality of filtered outputs into a wideband digital output signal having a second sampled rate.

20 Claims, 2 Drawing Sheets

OVERSAMPLED SYNTHESIZER SYSTEMS AND METHODS

TECHNICAL FIELD

The present invention relates generally to communication systems, and more particularly to oversampled synthesizer systems and methods for recombining a plurality of channels into a wideband signal.

BACKGROUND OF THE INVENTION

Filterbanks have been employed in many applications such as transmultiplexers, audio/image compression, and adaptive filtering. A typical perfect reconstruction filterbank is designed to filter a wide band signal comprised of a plurality of subbands or subchannels into the subbands or subchannels, process the subbands or subchannels (e.g., compress/decompress), and then recombine the subbands or subchannels into a wide band signal with an attempt to minimize distortion. Oversampled filterbanks are widely employed to reduce the computational complexity of signal processing algorithms, such as subband adaptive filtering techniques utilized in many audio/image compression techniques. After the signal channeling and signal combining algorithms are performed, the wideband signal is typically transmitted over a radio frequency (RF) wireless link to one or more other radio devices (e.g., user terminals). The transmission frequency of the RF wireless link can be at a substantially higher frequency than the processing frequency of the wideband signal.

SUMMARY OF THE INVENTION

In one aspect of the present invention, an oversampled synthesizer system is provided. An inverse Fourier transform component is configured to receive a plurality of digital input signals and produce a corresponding representation of a wideband signal as a plurality of parallel outputs. Each of the plurality of digital input signals has a first sampled rate. A plurality of digital filters are each configured to apply a transfer function to an associated one of the parallel outputs to produce a filtered output. A number of filters in the plurality of digital filters is less than a number of parallel outputs of the inverse Fourier transform component, such that at least one of the parallel outputs is not provided to any filter of the plurality of digital filters. An interpolation component is configured to combine the plurality of filtered outputs into a wideband digital output signal having a second sampled rate.

In accordance with another aspect of the present invention, a near perfect reconstruction filterbank system is provided. An oversampled channelizer is configured to receive a wideband digital input signal at a first sampled rate and provide a plurality of channelized outputs, each representing an associated frequency band and having a second sampled rate. A critically sampled channelizer is configured to produce a set of subbands, each representing an associated frequency band and having a third sampled rate, from each of the channelized outputs. A baseband processor is configured to perform at least one baseband processing function on the set of subbands from each of the channelized outputs. A critically sampled synthesizer is configured to combine each of a plurality of sets of subbands into a synthesized output signal having the second sampled rate. An oversampled synthesizer system includes an inverse Fourier transform component, having a plurality of outputs, and a plurality of digital filters, and is configured to produce a wideband signal representing the plurality of synthesized output signals. A number of outputs of the inverse Fourier transform is greater than the number of filters.

In accordance with yet another aspect of the present invention, a method is provided for reconstructing a wideband output signal having a first sampled rate from a plurality of digital input signals having a second sampled rate. An inverse Fourier transform is performed on the plurality of digital input signals to provide a plurality of intermediate outputs. A proper subset of the plurality of intermediate outputs is filtered to provide a plurality of filtered outputs. The plurality of filtered outputs are interpolated to provide the wideband output signal.

DETAILED DESCRIPTION OF INVENTION

The present invention relates to a filterbank architecture that minimizes distortion yet allows baseband processing to be performed efficiently. The filterbank architecture employs a near perfect reconstruction filterbank (NPRFB) where the subchannels can be reordered or combined with subchannels from other independent sources without alias distortion. The present invention utilizes an efficient oversampled synthesizer arrangement to provide an oversampled filterbank arrangement, but without the usual overhead necessary to support synthesis of an oversampled signal.

Figure 1:
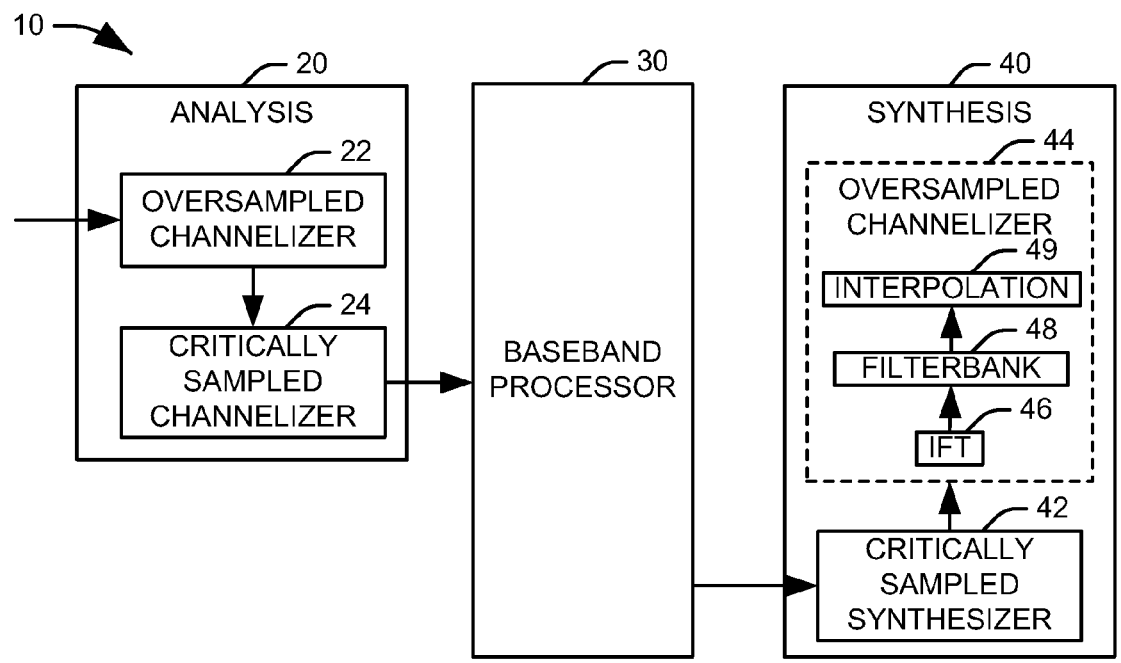
FIG. 1 illustrates a block diagram of a near perfect reconstruction filterbank in accordance of the present invention.

FIG. 1 illustrates a block diagram of a near perfect reconstruction filterbank (NPRFB) 10 in accordance of the present invention. It is to be appreciated that the present invention can be extended to any number of subchannels. Further, it will be appreciated that each component of the NPRFB 10 can be implemented in dedicated hardware, a general purpose processor executing software comprising computer executable instructions encoded on a non-transitory computer readable medium, or some combination of dedicated hardware and software. A number of possible applications will be apparent to one of skill in the art, but examples include switching subchannels between filterbanks with different sources, frequency translation of subchannels or groups of subchannels within a single filterbank, and efficient fractional oversampled filterbanks (e.g., oversampled by 3/2). Further, the NPRFB 10 can be configured to provide efficient non-uniform filterbanks (i.e., subchannels are oversampled at the rate required by the largest filter bandwidth, and smaller subchannels are combined to achieve the various bandwidths).

The NPRFB system 10 includes an analysis component 20, a baseband processor 30 and a synthesis component 40. The analysis component 20 receives a wideband digital input signal (e.g., complex signal) comprised of a plurality of subbands or subchannels over a particular frequency band having a particular channel order. The analysis component 20 includes an oversampled channelizer 22 and a critically sampled channelizer 24.

The oversampled channelizer 22 receives the wideband digital input signal at an associated sampled rate and provides a plurality of channelized outputs, each representing an associated frequency band. The oversampled channelizer 22 can include a memory configured to buffer the incoming wideband digital signal and allow for an oversampling of the digital signal at a desired oversampling ratio. The oversampled signal is filtered at a bank of filters and subjected to a discrete Fourier transform to provide the channelized outputs. The filters are selected for a flat and linear phase passband for just over half of the output band of its associated channelized output as well as good stop band rejection. As will be appreciated, each channelized output is sampled at a frequency rate equal to the sampled rate of the original wideband digital input signal, multiplied by the oversampling ratio and divided by the number of output channels.

The plurality of channelized outputs are provided to the critically sampled channelizer 24, which produces a plurality of subbands from each of the channelized outputs. Each channelized output is decimated into a plurality of individual streams and filtered at a bank of filters to provide a desired frequency response to the subbands and the filtered channelized output is subjected to a discrete Fourier transform to provide the plurality of subbands. The resulting plurality of subbands each has a sampled rate equal to the sampled rate associated with the channelized output divided by the number of subbands.

The subbands are then provided to the baseband processor 30 where any desired baseband processing techniques can be applied to the plurality of subbands. For example, the baseband processor 30 can comprise a controller for performing one or more algorithms that reorder the various subbands, provide additional subbands and/or replace certain subbands. It is to be appreciated that the baseband processor 30 can be a digital signal processor (DSP) or a plurality of DSPs. Alternatively, the baseband processor 30 can include the necessary functionality for storing, reordering and switching of subbands for reconstruction into a wideband digital output signal (e.g., complex signal).

The processed subbands are then provided to a critically sampled synthesizer 42 of the synthesis component 40, which combines each of a plurality of subsets of the plurality of subbands into an associated synthesized output. To this end, each subset of the plurality of subbands is provided to an inverse Fourier transform, which produces a representation of a combined signal at a plurality of taps. Each tap of the inverse Fourier transform component is filtered at an associated filterbank and interpolated to provide the synthesized output at a sampled rate equal to the product of sampled rate associated with the input subbands and the number of subbands within the subset. It will be appreciated that the transfer function associated with the filterbank used at the critically sampled synthesizer 42 can be determined from the transfer function of the filterbank in the critically sampled channelizer 24 according to the perfect reconstruction constraint.

In the present example, the synthesized outputs of the critically sampled synthesizer 42 are provided to an oversampled synthesizer 44 that recombines the synthesized outputs into a wideband digital signal. The plurality of synthesized outputs are received at an inverse Fourier transform component 46 configured to produce a wideband digital signal. For example, the inverse Fourier transform component 46 can be implemented as an inverse discrete Fourier transform (IDFT), such that the output of the inverse Fourier transform is a series of values, produced sequentially across a number of parallel taps, providing a representation of the combination of the channelized digital signals. In one implementation, conjugate symmetric inputs can be inserted into the inverse Fourier transform component 46 to ensure that the spectrum of the signal produced by the inverse Fourier component is real instead of complex.

The oversampled synthesizer 44 further comprises a filterbank 48 comprising a plurality of filters. In accordance with an aspect of the present invention, the filterbank 48 contains fewer filters than the number of taps on the inverse Fourier transform component 46. Accordingly, only a proper subset of the outputs from the inverse Fourier transform component 46 are provided to the filterbank, such that the data provided by at least one of the Fourier taps is not provided to the filterbank 48 and is effectively discarded. In one implementation, the number of filters in the filterbank 48 is equal to half of the number of taps on the inverse Fourier transform component 46, such that data from only half of the taps is utilized.

The plurality of filters comprising the filterbank 48 provide a polyphase decomposition of a transfer function configured to provide a pass band that encompasses a central portion of a frequency band associated with the signal, which contains the data of interest, and a stop band edge that excludes the central portion of a neighboring frequency band. The filtered data is provided to the interpolation component 49 and combined into a single wideband digital signal. In one implementation, the wideband digital signal is scaled by an associated scaling factor.

Figure 2:
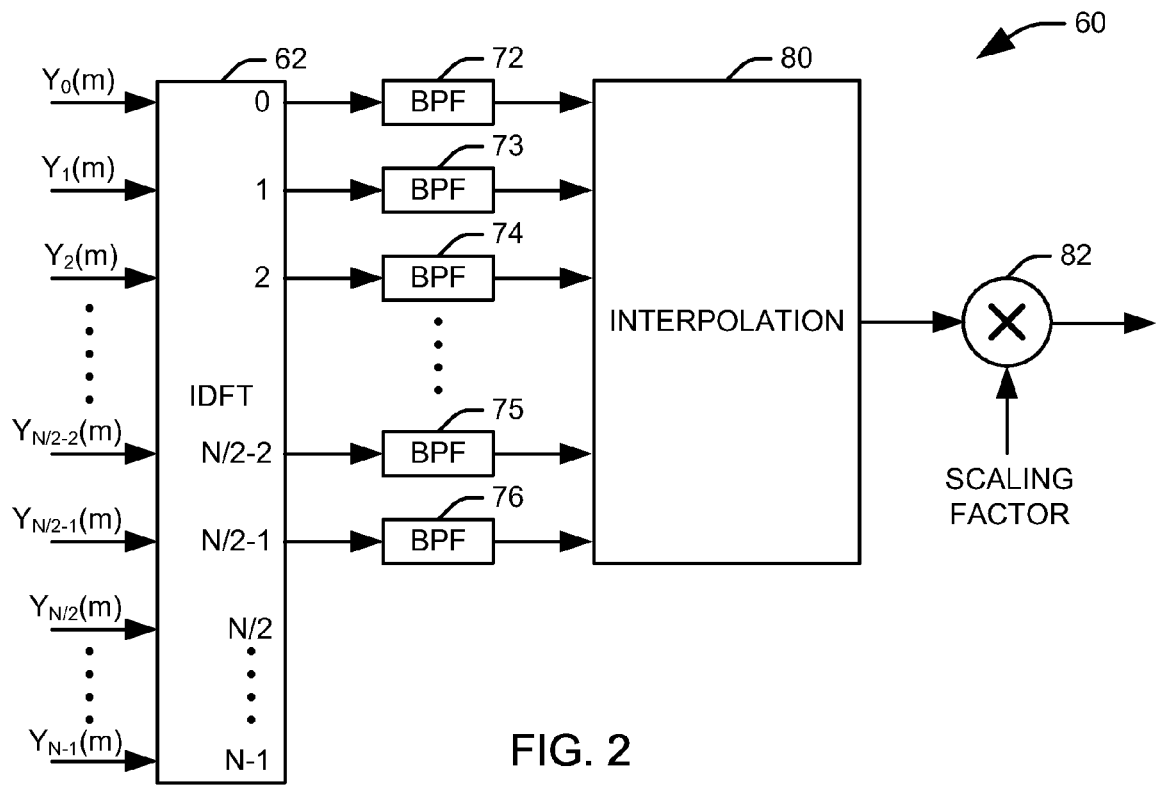
FIG. 2 illustrates a functional block diagram of one example of an oversampled synthesizer in accordance with an aspect of the present invention.

FIG. 2 illustrates a functional block diagram of one example of an oversampled synthesizer 60 in accordance with an aspect of the present invention. The oversampled synthesizer 60 receives a plurality of digital signals, representing respective frequency bands, and combines them to form a signal wideband digital signal. For example, the illustrated oversampled synthesizer 60 can receive a plurality of reconstructed channels output from a critically sampled synthesizer (not shown) as part of a near perfect reconstruction filterbank (NPRFB). In the illustrated implementation, the oversampled synthesizer 60 is configured operate with an oversampling ratio equal to two. Accordingly, the synthesizer 60 receives a number, N, of digital inputs each representing an associated frequency band and having a sampled rate, $F_{sy}$, and produces a wideband digital signal having a sampled rate $F_{sx} = F_{sy} * N/2$. It will be appreciated, however, that oversampled synthesizers having different sampling ratios can be used in accordance with an aspect of the present invention.

In the illustrated implementation, the oversampled synthesizer 60 includes an N-tap inverse discrete Fourier transform (IDFT) 62 configured to receive the plurality of digital inputs and provide a representation of a wideband digital signal representing the plurality of digital inputs. The oversampled synthesizer 60 further comprises a plurality of digital passband filters 72-76. In accordance with an aspect of the present invention, the oversampled synthesizer 60 utilizes a number of filters, N/2, equal to half the number of taps on the IDFT 62. Accordingly, only half of the IDFT inputs are provided to the digital passband filters 72-76. In the illustrated implementation, the first N/2 taps are used and the second N/2 taps are discarded.

In accordance with an aspect of the present invention, the plurality of filters comprising the filterbank 48 provide a polyphase decomposition of a transfer function and are configured to provide a pass band that covers a central portion of a frequency band associated with each digital input and a stop band edge that excludes the central portion of frequency bands associated with neighboring inputs. Assuming that the input signal, y(k), comprises a plurality, M, of central subbands, out of a plurality, K, of equally spaced subbands, a pass band edge, PB, of the filters can be configured such that:

$$PB \geq \frac{F_{sx}}{N/2} * \frac{(M/2+1)}{K}$$ Eq. 1

Similarly, a stop band edge, SB, of the filter is selected to guarantee that the non-zero region of neighboring interpolation images are within the stop band, such that:

$$SB \leq \frac{F_{sx}}{N/2} - \left[\frac{(M/2+1)}{K} * \frac{F_{sx}}{N/2}\right] = \frac{F_{sx}}{N/2}\left[1 - \frac{(M/2+1)}{K}\right]$$ Eq. 2

It will be appreciated that, in the illustrated implementation, there will be regions within the wideband signal in which the interpolation images of the input signal, y(k), will be zero, which can be treated as "Don't Care" bands for the filter. In the illustrated implementation, these Don't Care bands are centered at odd multiples of $F_{sx}/(N/2)$. These Don't Care regions can be exploited in the filter design to provide superior pass band and/or stop band performance for a given number of taps.

The output of each filter is received at an interpolation component 80. The interpolation component 80 constructs a wideband digital signal from the filtered outputs via interpolation. It will be appreciated that, since only N/2 filtered outputs are used in the reconstruction of the signal, the reconstructed signal will have a sampled rate, $F_{sx}$, equal to one-half the product of the number, N, of input signals and their associated sampled rate, $F_{sy}$. Accordingly, the oversampled inputs can be recombined without the need for additional processing. A scaling component 82 can be provided to provide a scale factor to the wideband digital output signal. For example, the signal produced at the interpolation component 80 can be multiplied by two to account for the omitted IDFT 62 taps.

Figure 3:
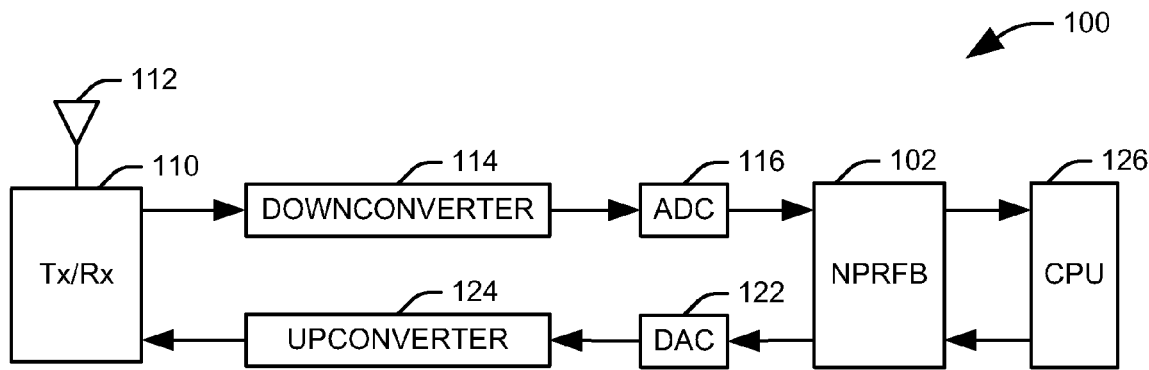
FIG. 3 illustrates a digital transponder that employs a near perfect reconstruction filterbank in accordance with an aspect of the present invention.

FIG. 3 illustrates a digital transponder 100 that employs a near perfect reconstruction filterbank (NPRFB) 102 in accordance with an aspect of the present invention. The digital transponder 100 can be, for example, part of a satellite or terrestrial base station device. The digital transponder 100 includes a transmitter/receiver component 110 having at least one antenna 112 for receiving and transmitting RF transmission signals. The transmitter/receiver component 110 receives wideband RF transmission signals and provides the wideband RF transmission signals to a downconverter 114 which provides a wideband intermediate frequency signal for processing. The downconverter 114 provides the wideband intermediate frequency signal to an analog-to-digital converter (ADC) 116. The ADC 116 converts the intermediate frequency wideband signal to a wideband digital signal for processing by the NPRFB 102.

The NPRFB 102 channelizes, processes, and recombines the digital wideband signal as illustrated in FIGS. 1 and 2. For example, the various subbands comprising the digital wideband signal can be resorted or reordered and recombined for transmission by the digital transponder 100. Alternatively, the subbands can be stored for reordering and combining with subbands from other wideband digital signals. The recombined signal is then provided to a digital-to-analog converter (DAC) 122, which converts the recombined digital signal to a wideband intermediate frequency analog signal. The wideband intermediate frequency analog signal is then upconverted to radio frequency at an upconverter 124 to provide an analog signal at a RF transmission frequency. The transmitter/receiver 110 then transmits the wideband analog signal through the antenna 112.

In the illustrated implementation, the NPRFB 102 includes an analysis portion that filters the digital wideband signal into a number of subbands. The subbands are then provided to a central processor unit 126. The central processor unit 126 can process the subbands, resort the subbands based on a transmission order or protocol and provide the resorted or reordered subbands back to the NPRFB 102. The NPRFB 102 includes a synthesis portion that recombines the subbands to provide a wideband digital signal centered at or near baseband. Alternatively, the intelligence for controlling the resorting order can be provided as part of the NPRFB 102 and the central processor unit 126 can be operative to program the NPRFB 102 and/or perform other functions associated with the digital transponder 100.

In one aspect of the present invention, the digital transponder 100 is operative to receive wideband signals from a plurality of different locations, break the wideband signals into subbands, resort or reorder the subbands with subbands from the wideband signal and/or other wideband signals, combine the reordered subbands into wideband signals, and transmit the wideband signals to one or more locations. For example, a first wideband signal can be received from a first location and a second wideband signal received from a second location. A first portion of the first wideband signal and the second wideband signal are destined for a third location, while a second portion of the first wideband signal and the second wideband signal are destined for a fourth location. The NPRFB 102 recombines the first portions of the first wideband signal and the second wideband signal, which is then transmitted to the third location. The NPRFB 102 also recombines the second portions of the first wideband signal and the second wideband signal, which is then transmitted to the fourth location. The NPRFB 102 can be preprogrammed, for example, via a preprogrammed read only memory (ROM) device, or programmed via the central processing unit 126.

Figure 4:
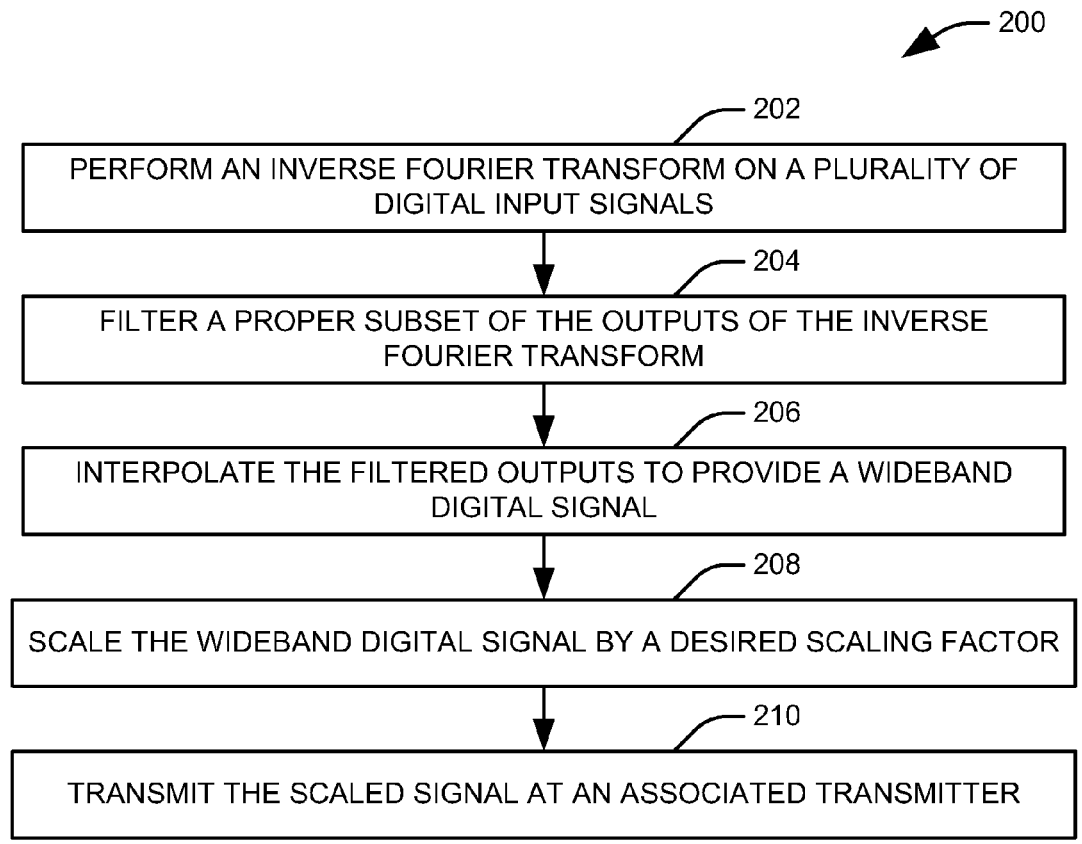
FIG. 4 illustrates a method for reconstructing a wideband output signal in accordance with an aspect of the present invention.

In view of the foregoing structural and functional features described above, a methodology in accordance with various aspects of the present invention will be better appreciated with reference to FIG. 4. While, for purposes of simplicity of explanation, the methodology of FIG. 4 is shown and described as executing serially, it is to be understood and appreciated that the present invention is not limited by the illustrated order, as some aspects could, in accordance with the present invention, occur in different orders and/or concurrently with other aspects from that shown and described herein. Moreover, not all illustrated features may be required to implement a methodology in accordance with an aspect the present invention.

FIG. 4 illustrates a method 200 for reconstructing a wideband output signal, having a first sampled rate, from a plurality of digital input signals, having a second sampled rate, in accordance with an aspect of the present invention. At 202, an inverse Fourier transform is performed on the plurality of digital input signals to provide a plurality of intermediate outputs. At 204, a proper subset of the plurality of intermediate outputs is filtered to provide a plurality of filtered outputs. In one implementation, the proper subset can include half of the outputs of the inverse Fourier transform. At 206, the plurality of filtered outputs are interpolated to provide the wideband output signal. At 208, the wideband output signal is scaled by a desired scaling factor. In one implementation, the scaling factor is equal to two. At 210, the wideband output signal is transmitted at an associated transmitter. For example, the wideband output signal can be converted to an analog signal, upconverted to radio frequencies, and transmitted.

What has been described above includes exemplary implementations of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. An oversampled synthesizer system, comprising:
   an inverse Fourier transform component configured to receive a plurality of digital input signals, each having a first sampled rate and produce a corresponding representation of a wideband signal as a plurality of parallel outputs;
   a plurality of digital filters, each configured to apply a transfer function to an associated one of the parallel outputs to produce a filtered output, a number of filters in the plurality of digital filters being less than a number of parallel outputs of the inverse Fourier transform component, such that at least one of the parallel outputs is not provided to any filter of the plurality of digital filters, wherein each of the plurality of digital filters has a pass band that covers a central portion of a frequency band of the associated one of the parallel outputs and a stop band that excludes a central portion of frequency bands associated with parallel outputs neighboring the associated one of the parallel outputs; and
   an interpolation component configured to combine the plurality of filtered outputs into a wideband digital output signal having a second sampled rate, such that the second sampled rate is substantially equal to a product of the first sampled rate and the number of filters in the plurality of digital filters.

2. The oversampled synthesizer system of claim 1, wherein the second sampled rate is less than the product of the first sampled rate and a number of digital inputs comprising the plurality of digital inputs.

3. The oversampled synthesizer system of claim 2, wherein the second sampled rate is one-half of the product of the first sampled rate and a number of digital inputs comprising the plurality of digital inputs.

4. The oversampled synthesizer system of claim 2, wherein the number of filters in the plurality of digital filters is one-half of a number of parallel outputs from the inverse Fourier transform component, such that one-half of the parallel outputs are not provided to the plurality of digital filters.

5. The oversampled synthesizer system of claim 1, further comprising a scaling component configured to apply a scaling factor to the wideband digital output, wherein the scaling factor is based on the number of digital filters in the plurality of digital filters.

6. A near perfect reconstruction filterbank system comprising:
   an oversampled synthesizer system, comprising: an inverse Fourier transform component configured to receive a plurality of digital input signals, each having a first sampled rate and produce a corresponding representation of a wideband signal as a plurality of parallel outputs; a plurality of digital filters, each configured to apply a transfer function to an associated one of the parallel outputs to produce a filtered output, a number of filters in the plurality of digital filters being less than a number of parallel outputs of the inverse Fourier transform component, such that at least one of the parallel outputs is not provided to any filter of the plurality of digital filters, wherein each of the plurality of digital filters has a pass band that covers a central portion of a frequency band of the associated one of the parallel outputs and a stop band that excludes a central portion of frequency bands associated with parallel outputs neighboring the associated one of the parallel outputs; and an interpolation component configured to combine the plurality of filtered outputs into a wideband digital output signal having a second sampled rate, such that a second sampled rate is substantially equal to a product of the first sampled rate and the number of filters in the plurality of digital filters and further comprising:
   an oversampled channelizer configured to receive a wideband digital input signal at the second sampled rate and provide a plurality of channelized outputs, each representing a first associated frequency band and having the first sampled rate;
   a critically sampled channelizer, configured to produce a set of subbands, each representing a second associated frequency band and having a third sampled rate, from each of the channelized outputs;
   a baseband processor configured to perform at least one baseband processing function on the set of subbands from each of the channelized outputs; and
   a critically sampled synthesizer configured to combine each of a plurality of sets of subbands into one of the plurality of digital input signals.

7. The near perfect reconstruction filterbank system of claim 6, the plurality of digital input signals being conjugate symmetric.

8. The near perfect reconstruction filterbank system of claim 6, the baseband processor being configured to reorder a plurality of subbands comprising the set of subbands from each of the channelized outputs.

9. A near perfect reconstruction filterbank system comprising:
   an oversampled channelizer configured to receives a wideband digital input signal at a first sampled rate and provide a plurality of channelized outputs, each representing an associated frequency band and having a second sampled rate;
   a critically sampled channelizer, configured to produce a set of subbands, each representing an associated frequency band and having a third sampled rate, from each of the channelized outputs;
   a baseband processor configured to perform at least one baseband processing function on the set of subbands from each of the channelized outputs;
   a critically sampled synthesizer configured to combine each of a plurality of sets of subbands into a synthesized output signal having the second sampled rate; and
   an oversampled synthesizer system, comprising an inverse Fourier transform component, having a plurality of outputs, and a plurality of digital filters, is configured to produce a wideband signal having the second sampled rate, the wideband signal representing the plurality of synthesized output signals, wherein a number of outputs of the inverse Fourier transform is greater than the number of filters, such that at least one of the plurality of outputs is not provided to any filter of the plurality of digital filters, wherein each of the plurality of digital filters has a pass band that covers a central portion of a frequency band of an associated one of the plurality of outputs and a stop band that excludes a central portion of frequency bands associated with each of the plurality outputs neighboring the associated one of the plurality of outputs;

wherein the second sampled rate is substantially equal to a product of the first sampled rate and the number of filters in the plurality of digital filters.

10. The near perfect reconstruction filterbank system of claim 9, the oversampled synthesizer further comprising an interpolation component configured to combine respective outputs of the plurality of digital filters.

11. The near perfect reconstruction filterbank system of claim 9, wherein the number of filters in the plurality of digital filters is one-half of a number of outputs of the inverse Fourier transform component, such that one-half of the outputs are not provided to the plurality of digital filters.

12. The near perfect reconstruction filterbank system of claim 9, the plurality of synthesized output signals being conjugate symmetric.

13. The near perfect reconstruction filterbank system of claim 9, the baseband processor being configured to replace one of a plurality of subbands with another subband.

14. The near perfect reconstruction filterbank system of claim 9, the baseband processor being configured to add a subband to the plurality of subbands.

15. A digital transponder assembly comprising:
a near perfect reconstruction filterbank system comprising: an oversampled channelizer configured to receives a wideband digital input signal at a first sampled rate and provide a plurality of channelized outputs, each representing an associated frequency band and having a second sampled rate; a critically sampled channelizer, configured to produce a set of subbands, each representing an associated frequency band and having a third sampled rate, from each of the channelized outputs; a baseband processor configured to perform at least one baseband processing function on the set of subbands from each of the channelized outputs; a critically sampled synthesizer configured to combine each of a plurality of sets of subbands into a synthesized output signal having the second sampled rate; and an oversampled synthesizer system, comprising an inverse Fourier transform component, having a plurality of outputs, and a plurality of digital filters, is configured to produce a wideband signal having the second sampled rate, the wideband signal representing the plurality of synthesized output signals, wherein a number of outputs of the inverse Fourier transform is greater than the number of filters, such that at least one of the plurality of outputs is not provided to any filter of the plurality of digital filters, wherein each of the plurality of digital filters has a pass band that covers a central portion of a frequency band of an associated one of the plurality of outputs and a stop band that excludes a central portion of frequency bands associated with each of the plurality outputs neighboring the associated one of the plurality of outputs; wherein the second sampled rate is substantially equal to a product of the first sampled rate and the number of filters in the plurality of digital filters, and further comprising:
a transceiver/receiver component configured to receive a radio frequency (RF) wideband input signal;
a downconverter configured to convert the RF wideband input signal to an intermediate frequency (IF) signal;
an analog-to-digital converter configured to convert the IF signal to a digital wideband input signal;
a digital-to-analog converter configured to convert a digital wideband output signal to an analog (IF) signal;
an upconverter configured to convert the IF wideband input signal to an RF signal, the RF signal being provided to the transceiver/receiver component for broadcast.

16. A method for reconstructing a wideband output signal having a first sampled rate from a plurality of digital input signals having a second sampled rate, the method comprising:
performing an inverse Fourier transform on the plurality of digital input signals to provide a plurality of intermediate outputs;
filtering, at N number of digital filters in a filterbank, a proper subset of the plurality of intermediate outputs to provide a plurality of filtered outputs, wherein each of the N number of digital filters has a pass band that covers a central portion of a frequency band of an associated one of the intermediate outputs and a stop band that excludes a central portion of frequency bands associated with the intermediate outputs neighboring the associated one of the intermediate outputs, wherein N is a positive integer greater than two and less than the number of intermediate outputs; and
interpolating the plurality of filtered outputs to provide the wideband output signal, such that the second sampled rate is substantially equal to a product of the first sampled rate and N.

17. The method of claim 16, further comprising scaling the wideband output signal by a scale factor that is based on N.

18. The method of claim 16, wherein the first sampled rate is less than the product of the second sampled rate and a number of digital inputs comprising the plurality of digital input signals.

19. The method of claim 16, wherein the first sampled rate is one-half of the product of the second sampled rate and a number of digital inputs comprising the plurality of digital inputs.

20. The method of claim 16, further comprising converting the wideband digital signal to a wideband analog signal, upconverting the wideband digital signal to a radio frequency, and broadcasting the radio frequency signal.

* * * * *